United States Patent
Woolard et al.

(10) Patent No.: US 11,240,943 B2
(45) Date of Patent: Feb. 1, 2022

(54) CERAMIC COATED FLOW CHANNELS FOR ELECTRICAL ISOLATION AND THERMAL TRANSFER

(71) Applicant: EATON CORPORATION, Cleveland, OH (US)

(72) Inventors: David Glenn Woolard, Asheville, NC (US); Paul Thomas Murray, Horse Shoe, NC (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 790 days.

(21) Appl. No.: 14/827,409

(22) Filed: Aug. 17, 2015

(65) Prior Publication Data
US 2017/0055369 A1 Feb. 23, 2017

(51) Int. Cl.
*H05K 7/20* (2006.01)
*H01L 23/473* (2006.01)

(52) U.S. Cl.
CPC ....... *H05K 7/20927* (2013.01); *H01L 23/473* (2013.01)

(58) Field of Classification Search
CPC .......................... H01L 23/473; H05K 7/20927
See application file for complete search history.

(56) References Cited

U.S. PATENT DOCUMENTS

| | | | |
|---|---|---|---|
| 2004/0144996 A1* | 7/2004 | Inoue | H01L 23/4006 257/200 |
| 2005/0217823 A1* | 10/2005 | Osanai | B22D 19/0072 165/80.2 |
| 2008/0060791 A1* | 3/2008 | Strobel | F28F 1/04 165/80.4 |
| 2008/0196869 A1* | 8/2008 | Behrens | F28F 3/12 165/104.33 |
| 2010/0085712 A1* | 4/2010 | Hrehor, Jr. | H05K 7/20772 361/699 |
| 2010/0175857 A1* | 7/2010 | Gerstler | F28D 15/00 165/104.31 |
| 2014/0071626 A1* | 3/2014 | Campbell | B23P 15/26 361/700 |

* cited by examiner

*Primary Examiner* — Christopher R Zerphey
*Assistant Examiner* — Melodee Jefferson
(74) *Attorney, Agent, or Firm* — Eckert Seamans Cherin & Mellott, LLC

(57) ABSTRACT

The disclosed concept relates to electrical isolation between power electronic and cooling and/or mounting components and, in particular, a ceramic layer disposed on one or more portions of the cooling and/or mounting components to provide electrical isolation, as well as, a thermally conductive path to remove heat produced by the power electronic component.

11 Claims, 6 Drawing Sheets

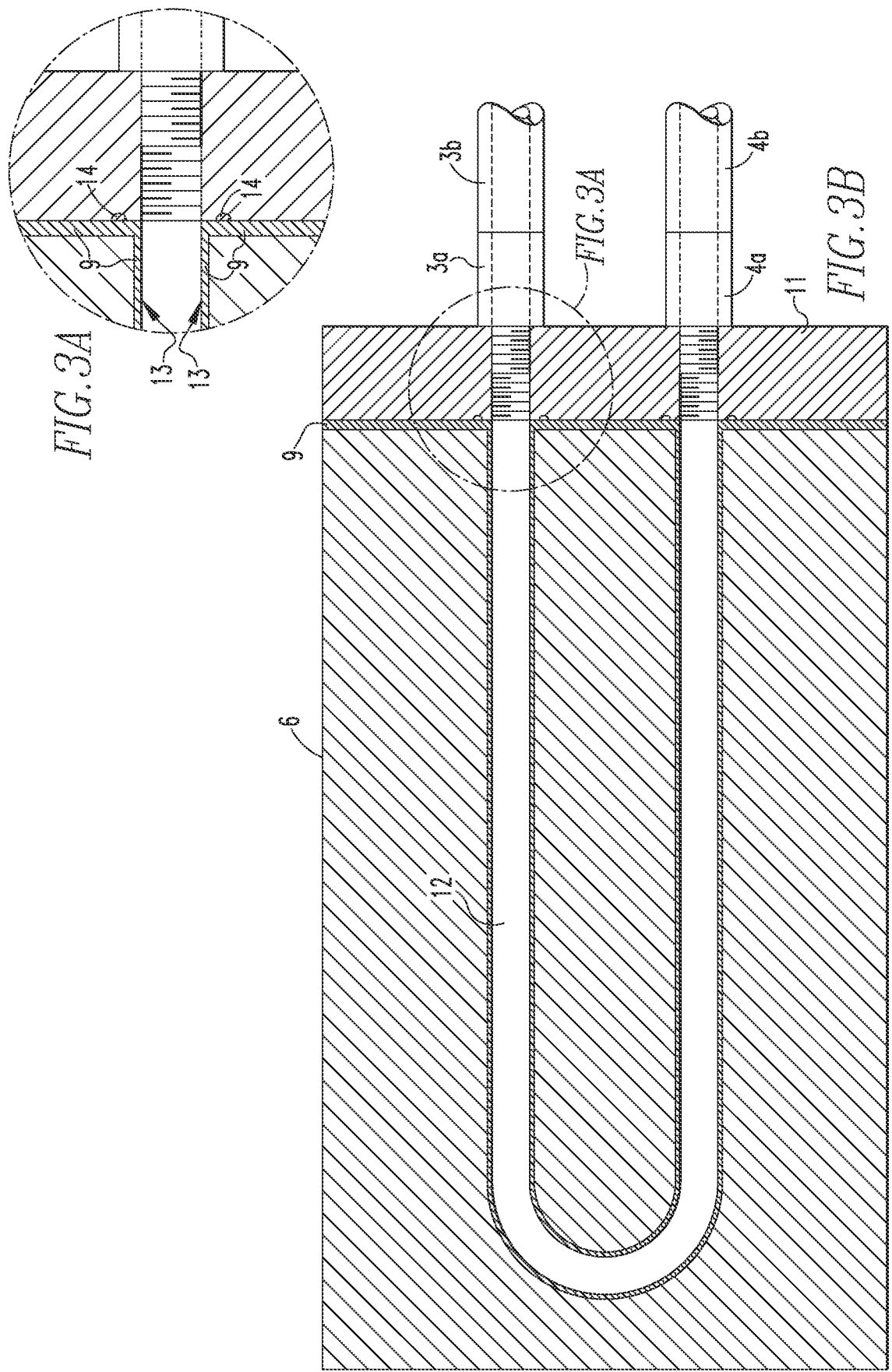

CERAMIC COATED FLOW CHANNELS FOR ELECTRICAL ISOLATION AND THERMAL TRANSFER

BACKGROUND

Field

The disclosed concept relates generally to power electronic devices, cooling and/or mounting devices therefor and, ceramic coatings applied to the cooling and/or mounting devices.

Background Information

It is known in the art to provide cooling and/or mounting devices with power electronic devices for the purpose of removing at least a portion of the heat generated by the power electronic devices, such as, one or more diodes or insulated-gate bipolar transistors. It is also known that in certain instances the power electronic devices may operate at voltages that exceed their isolation rating. Therefore, the cooling and/or mounting devices are also at an elevated potential voltage. It is necessary to isolate the power electronic devices from ground to prevent arcing or ground currents, which can cause noise on a system, degrade or damage a system, and potentially lead to operator injury or death. If the cooling and/or mounting devices use electrically conductive cooling medium, such as water, the entire water circuit can serve as a path to ground thereby resulting in the cooling circuit itself being unsafe.

Isolation pads and films are known for use in isolating the power electronic devices. However, there are disadvantages associated with many of these pads and films. For example, it has been found that the pads or films can have poor thermal conductivity and/or poor adhesion. In some instances, a thermal grease or epoxy may be required to adhere the pad or film to the surface of the device. The use of an intermediate layer for purposes of enhancing adherence may result in increased contact losses and reduced effective conductivity.

There is room for improvement in power electronic devices and the cooling and/or mounting devices associated therewith. It would be advantageous for the cooling and/or mounting devices to include a ceramic coating or layer applied to surfaces in contact with the liquid cooling medium that circulates within the cooling and/or mounting device, to provide a means for thermal transfer, while providing electrical isolation.

SUMMARY

These needs and others are met by embodiments of the disclosed concept, which are directed to power electronic devices and cooling and/or mounting devices associated therewith, and furthermore, to coating compositions for use in applying protective coatings to portions of the cooling and/or mounting devices to provide effective electrical isolation and thermal transfer.

As one aspect of the disclosed concept, an apparatus including a power electronic device and a liquid-cooled cooling device is provided. The power electronic device is connected to the liquid-cooled cooling device. The cooling device includes an outer surface, an inner portion and a flow channel formed within the inner portion. The flow channel includes an inlet aperture and an outlet aperture formed in a side wall of the cooling device. A cavity extends between the inlet aperture and the outlet aperture which is structured to circulate liquid coolant through the cooling device. The apparatus also includes an isolating manifold. The cooling device and isolating manifold are positioned such that the side wall containing the inlet and outlet apertures forms an interface with a side wall of the isolating manifold. A first aperture is formed in the side wall of the isolating manifold to align with the inlet aperture in the cooling device and a second aperture is formed in the side wall of the isolating manifold to align with the outlet aperture in the cooling device. A ceramic composition is deposited on the cooling device/isolating manifold interface and on the surface of the cavity of the flow channel to form a ceramic coating thereon. The ceramic coating is effective to reduce thermal contact and conductivity tosses, and provide electrical isolation.

In certain embodiments, the ceramic coating composition is deposited directly on the side wall of the cooling device to form the ceramic coating at the interface with the side wall of the isolating manifold.

In other embodiments, a seal mechanism having an outer surface is disposed at the cooling device/isolating manifold interface and the ceramic composition is deposited on the side wall of the cooling device, and the seal mechanism is in contact with the ceramic coating and the side wall of the isolating manifold. In certain embodiments, the seal mechanism is a gasket or an O-ring.

In certain embodiments, the ceramic composition is selected from pure ceramic, ceramic-based compositions and ceramic-containing compositions. The ceramic can be selected from boron nitride, alumina, aluminum nitride, silica and mixtures thereof.

The isolating manifold can be constructed of an insulating material, such as, but not limited to, plastic, ceramic or a mixture thereof. Each of the first and second apertures formed in the side wall of the isolating manifold can have inserted therein a connector for engaging a path to a liquid coolant source. The connector in the first aperture can interface with the inlet aperture of the flow channel and a supply line from the liquid coolant source, and the connector in the second aperture can interface with the outlet aperture of the flow channel and a discharge line to the liquid coolant source. Each connector can have a threaded connection.

In another aspect of the disclosed concept, an apparatus including a power electronic device and a liquid-cooled cooling device is provided. The power electronic device is connected to the liquid-cooled cooling device. The cooling device includes an outer surface, an inner portion and a flow channel formed within the inner portion. The flow channel includes an inlet and an outlet formed in a side wall of the cooling device. A cavity extends between the inlet and the outlet which is structured to circulate liquid coolant through the cooling device. A ceramic composition is deposited on the surface of the cavity of the flow channel to form a ceramic coating thereon. The ceramic coating is effective to reduce thermal contact losses and thermal conductivity losses. The apparatus also includes an isolating manifold. The isolating manifold includes a side wall, a face wall opposite the side wall, a first aperture extending from the side wall of the isolating manifold through the face wall, a second aperture extending from the side wall of the isolating manifold through the face wall, a first elongated tubular insert formed in the side wall of the isolating manifold to engage the first aperture and align with the inlet of the flow channel in the cooling device, and a second elongated tubular insert formed in the side wall of the isolating manifold to engage the second aperture and align with the outlet of the flow channel in the cooling device. The first and second elongated tubular inserts extending from the isolating manifold through the interface and into the cooling device. The cooling device and the isolating manifold being positioned such that the side wall of the cooling device forms an interface with the side wall of the isolating manifold. Further included is a first seal mechanism positioned at an interface of the first elongated tubular insert and the inlet of the flow channel, and a second seal mechanism positioned at an interface of the second elongated tubular insert and the outlet of the flow channel. A ceramic coating is formed on the surface of the cavity of the flow channel where it contacts the first and second seal mechanisms. The ceramic coating is effective to reduce thermal contact and conductivity losses, and provide electrical isolation.

The isolating manifold and the first and second elongated tubular inserts can be manufactured such as to form a single part.

BRIEF DESCRIPTION OF THE DRAWINGS

A full understanding of the disclosed concept can be gained from the following description of the preferred embodiments when read in conjunction with the accompanying drawings in which:

FIG. 3A is a schematic showing a detailed view of the ceramic coated flow channel shown in FIG. 3, in accordance with certain embodiments of the disclosed concept;

FIG. 3B is a schematic showing a detailed view of the isolating manifold shown in FIG. 3, in accordance with certain embodiments of the disclosed concept;

DESCRIPTION OF THE PREFERRED EMBODIMENTS

Figure 1:
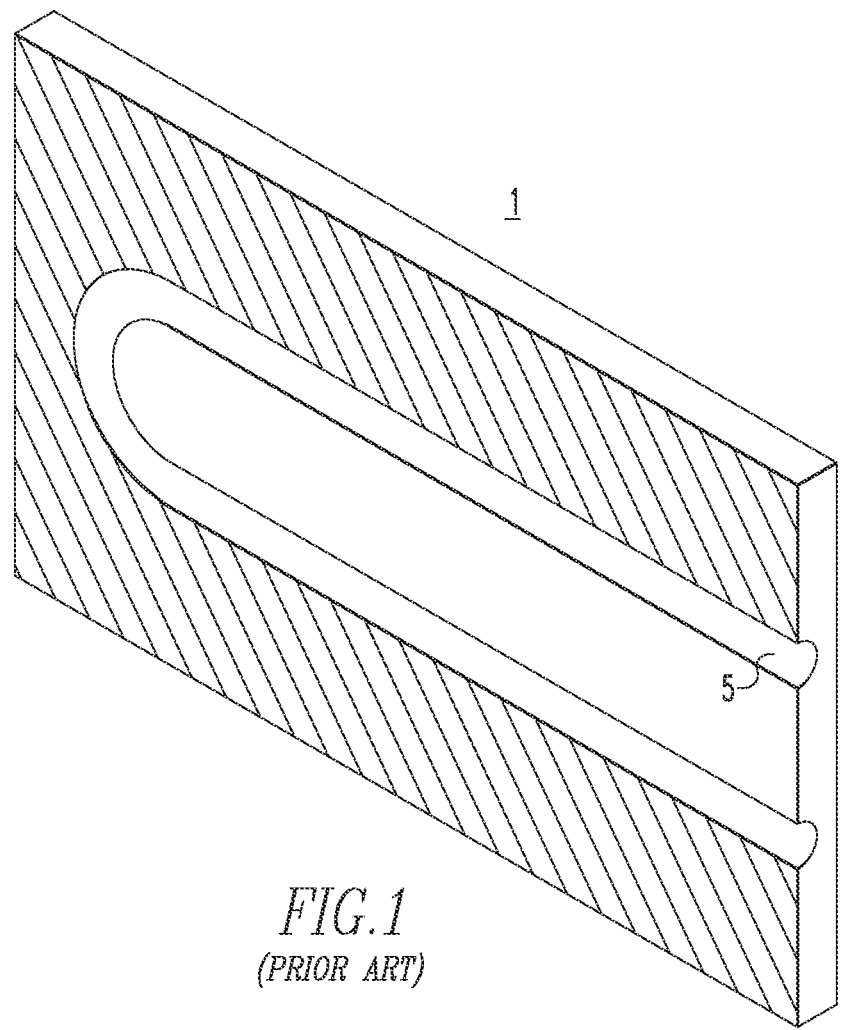
FIG. 1 is a schematic showing a cross-section view of a liquid-cooled cold plate, in accordance with the prior art.

Directional phrases used herein, such as, for example, left, right, clockwise, counterclockwise, top, bottom and derivatives thereof, relate to the orientation of the elements shown in the drawings and are not limiting upon the claims unless expressly recited therein.

As employed herein, the statement that two or more parts are "coupled" or "connected" together shall mean that the parts are joined together either directly or joined through one or more intermediate parts.

As employed herein, the term "number" shall mean one or an integer greater than one (i.e., a plurality).

The disclosed concept generally relates to power electronic devices and cooling and/or mounting devices therefor. Further, the disclosed concept generally relates to coating all surfaces having contact with the liquid cooling medium that flows through the cooling and/or mounting device or forming the surfaces of an insulating material to provide electrical isolation between the cooling and/or mounting device and the liquid cooling medium.

FIG. 1 is a schematic showing a cross-section view of a liquid-cooled cold plate 1 in accordance with the prior art. The cold plate 1 includes a flow channel 5 formed, e.g., bore, in the interior of the cold plate 1 for circulating liquid coolant (not shown) there through.

Figure 2:
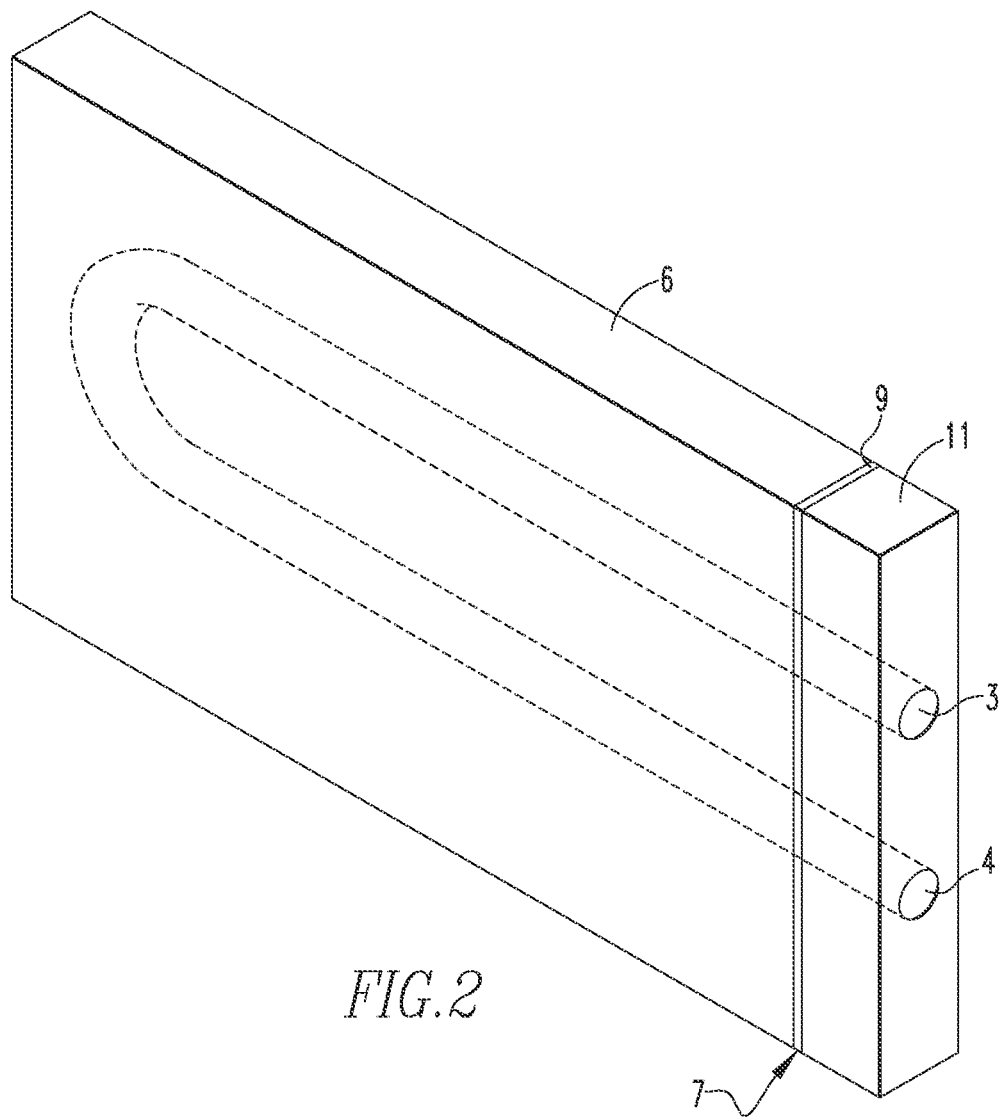
FIG. 2 is a schematic showing a cooling device including a cold plate, an isolating manifold and a ceramic coating layer, in accordance with certain embodiments of the disclosed concept.

FIG. 2 is a schematic showing an isometric view of a cooling device in accordance with certain embodiments of the disclosed concept. As shown in FIG. 2, the cooling device includes a liquid-cooled cold plate 6, an isolating manifold 11, a first aperture 3 and a second aperture 4 formed in the isolating manifold 11, and a ceramic coating or layer 9. The cold plate 6 and the isolating manifold 11 are positioned such that a side surface of each of the cold plate 6 and the isolating manifold 11 form an interface 7, and the ceramic coating 9 is disposed at the interface 7. Each of the side surface of the cold plate 6 and the side surface of the isolating manifold 11 contact the ceramic coating 9. The ceramic coating 9 is formed by depositing a ceramic coating composition onto the side surface of the cold plate 6.

Various cooling devices are known in the art, such as, but not limited to liquid cold plates. The liquid associated with a cold plate is referred to as the primary cooling source, which can include, but is not limited to, water, refrigerant or phase change medium. The disclosed concept can be equally applied to a variety of other cooling devices.

The isolating manifold is constructed of an insulating material, such as, but not limited to, ceramic, plastic or a combination thereof.

Figure 2A:
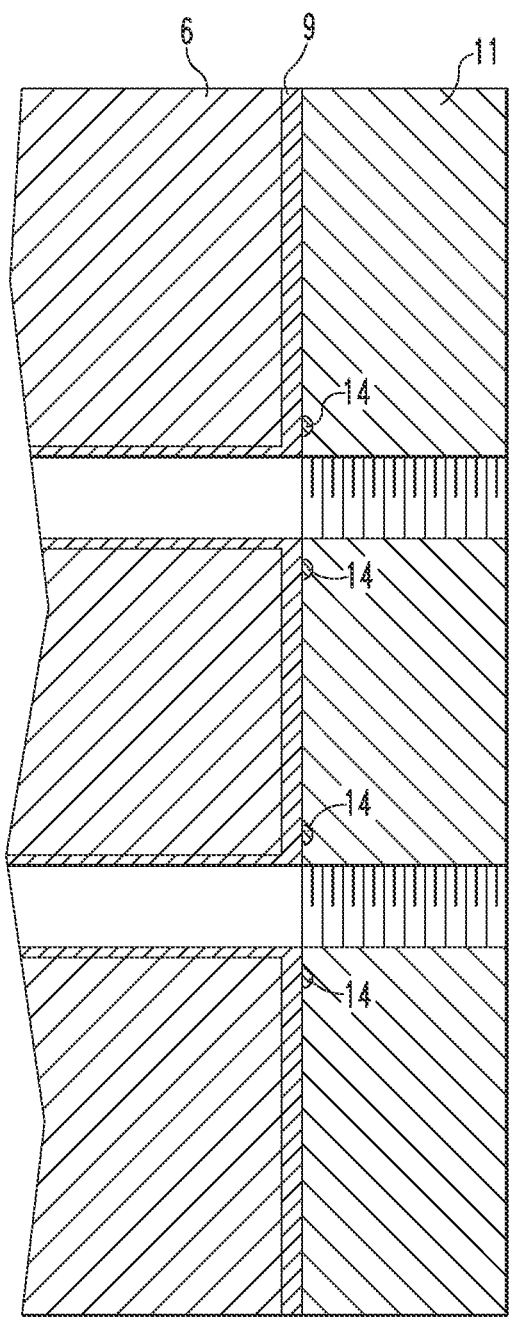
FIG. 2A is a schematic showing a detailed cross-section view of the cold plate and isolating manifold interface of the cooling device of FIG. 2, in accordance with certain embodiments of the disclosed concept.

In certain other embodiments, a seal mechanism is positioned at the interface 7. FIG. 2A is a detailed view of the interface 7 and ceramic coating 9 as shown in FIG. 2. In addition, FIG. 2A includes seal mechanism 14. In FIG. 2A, the ceramic coating 9 is disposed between the side surface of the cold plate 6 and the seal mechanism 14. The ceramic coating 9 is formed by depositing a ceramic composition directly onto the side surface of the cold plate 6. One side of the seal mechanism 14 contacts the ceramic coating 9 and the other side of the seal mechanism 14 contacts the side surface of the isolating manifold 11. The seal mechanism 14 prevents liquid coolant from passing through the interface formed by the side surfaces of the cold plate 6 and the isolating manifold 11. The seal mechanism 14 can include a wide variety of mechanisms known in the art including, but not limited to, an elastomeric ring, such as, but not limited to an O-ring or gasket.

Figure 3:
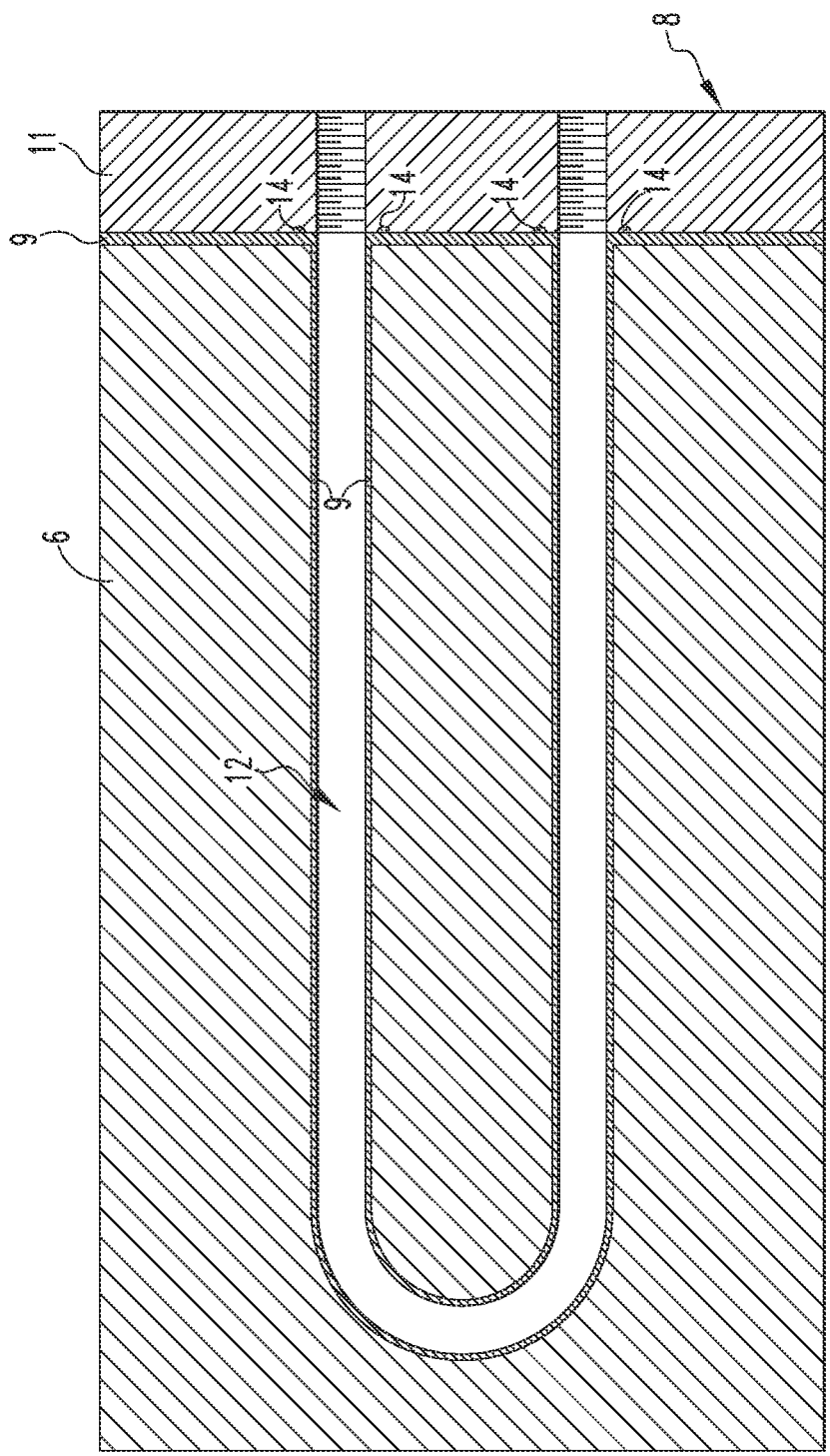
FIG. 3 is a schematic showing a cross-section view of the cooling device of FIG. 2, including a ceramic coated flow channel positioned within the cooling device, in accordance with certain embodiments of the disclosed concept.

FIG. 3 is a schematic showing a cross-section view of the cooling device shown in FIG. 2. FIG. 3 includes the cold plate 6, the isolating manifold 11 and the ceramic coating 9 as shown in FIG. 2. In addition, FIG. 3 shows a ceramic coated flow channel 12 formed, e.g., bored, within the cooling device, and an outer face 8 of the isolating manifold 11. The first and second apertures 3,4 (shown in FIG. 2) are each formed in the face 8 as shown in FIG. 2, The first aperture 3 aligns with an inlet of the flow channel 12 and the second aperture 4 aligns with an outlet of the flow channel 12. Liquid coolant (not shown) is circulated through the flow channel 12. As shown in FIG. 3, the flow channel 12 has a U-shape, however, it is understood that other shapes may be used. In general, liquid coolant is provided from a line or path (not shown) wherein one end is connected to a supply source, e.g., tank, of liquid coolant (not shown) and an opposite end is engaged in the first aperture 3. The liquid coolant enters at one end of the flow channel 12, circulates through the flow channel 12, exits at the other end of the flow channel 12 and is returned via a discharge line (not shown) engaged in the second aperture 4 to the liquid coolant supply source.

FIG. 3A is a schematic showing a detailed view of the ceramic coated flow channel 12 shown in FIG. 3. As shown in FIG. 3A, the flow channel 12 has a surface 13 and the ceramic coating layer 9 is applied to the surface 13. Typically, the ceramic coating layer 9 is applied only to the surface 13 of the flow channel 12 that is positioned within the cold plate 6. That is, any portion of the flow channel 12 that may extend into the isolating manifold 11 does not need to be coated because the isolating manifold 11 is constructed of an insulating material.

FIG. 3B is a schematic showing a detailed view of the isolating manifold 11. As shown in FIG. 3B, threaded connectors 3a, 4a are positioned in the first and second apertures 3,4 (shown in FIG. 2), respectively. A supply line 3b is coupled to the threaded connector 3a and a discharge line 4b is coupled to the threaded connector 4a. The supply line 3b and the discharge line 4b are connected to the liquid coolant supply source (not shown). Suitable threaded connectors 3a and 4a for use in the disclosed concept can be selected from a wide variety of conventional nozzles and fittings known in the art.

In general, all of the surfaces that have contact with the liquid cooling medium are either coated or made of insulating material to provide electrical isolation between the cooling or mounting device and the liquid cooling medium. In certain embodiments, the cooling device itself is at the same potential voltage as the power electronic device, while the cooling medium is insulated and at a different potential voltage. The cooling medium can be at ground potential or another potential voltage.

Figure 4:
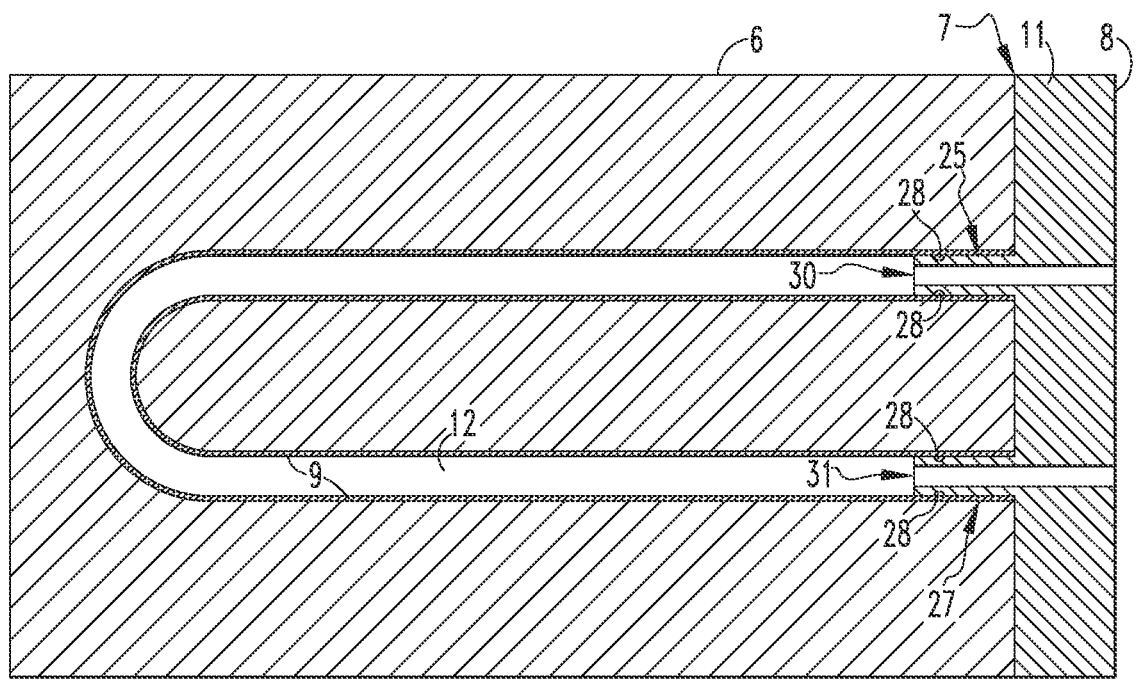
FIG. 4 is a schematic showing a cross-section view of a cooling device including a cold plate, an isolating manifold, a ceramic coated flow channel, and elongated tubular inserts, in accordance with certain embodiments of the disclosed concept.

FIG. 4 is a schematic showing a cross-section view of a cooling device in accordance with certain embodiments of the disclosed concept, including the cold plate 6, the interface 7 and the isolating manifold 11. In addition, FIG. 4 shows the ceramic coated flow channel 12 through which liquid coolant (not shown) circulates. The ceramic coated flow channel 12 is positioned within the cold plate 6 and does not extend beyond the interface 7 into the isolating manifold 11. Therefore, only the portion of the flow channel 12 that is positioned within the cold plate 6 is coated. In this embodiment, if there is any portion of the flow channel 12 that extends through the isolating manifold 11, which is constructed of an insulating material, there is no need for application of the coating. In addition, FIG. 4 shows the first and second apertures 3,4 (shown in FIG. 2), each formed in the outer face 8 of the isolating manifold 11 and extending a distance there through. In alignment with each of the apertures 3,4 is a first elongated tubular insert 25 and a second elongated tubular insert 27, respectively, each of which extends from a face opposite the outer face 8 and, aligns and interfaces with a corresponding inlet 30 and outlet 31, respectively, of the flow channel 12. A seal mechanism 28 is positioned between (e.g., at the interface of) the elongated tubular inserts 25,27 and the corresponding inlet/outlet 30,31 of the flow channel 12. As previously described herein, suitable seal mechanisms for use in the disclosed concept are known in the art and include, but are not limited to, O-rings and gaskets. The seal mechanism 28 prevents coolant from passing through the interface 7. The seal mechanism 28 is composed of an insulating material and therefore, it is typically not ceramic coated. Since coolant does not pass through the interface 7, a ceramic coating does not need to be applied to the interface 7 (formed between the cold plate 6 and the isolating manifold 11). Each of the elongated tubular inserts 25,27 is sized such that the length is sufficient to meet electrical creep clearance requirements between the coolant and the interface 7. A supply line and a discharge line can be engaged with apertures 3, 4, respectively.

Figure 4A:
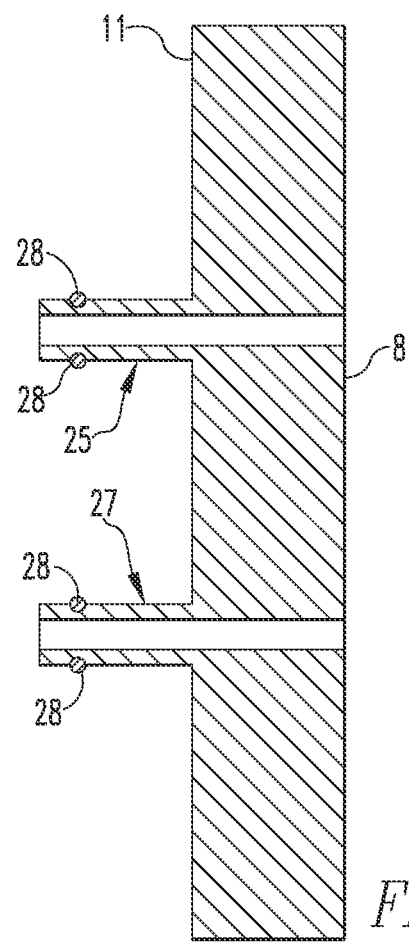
FIG. 4A is a schematic showing a detailed view of the isolating manifold shown in FIG. 4, in accordance with certain embodiments of the disclosed concept.

FIG. 4A is a schematic of a detailed view of the isolating manifold 11 in FIG. 4 including the elongated tubular inserts 25 and 27. In certain embodiments, the isolating manifold 111 and the inserts 25 and 27 are fabricated to form a single integrated component composed of the same material.

Deposition or application of the ceramic composition to form a ceramic coating layer (on the interfaces of the cold plate and isolating manifold and the sealing mechanism, the inner surface of the flow channel and the outer surface of the flow channel) can be accomplished using various conventional apparatus and techniques known in the art, such as, spraying, brushing, wiping and the like. The ceramic coating composition can include pure ceramic compositions, ceramic-based compositions and ceramic-containing compositions. Suitable ceramics for use can be selected from a wide variety of ceramics known in the art, such as, but not limited to, boron nitride, alumina, aluminum nitride, silica and mixtures thereof. In certain embodiments, the ceramic composition is Thermolon®, which is commercially available from Porcelain Industries.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. An apparatus, comprising:
   a power electronic device;
   a cold plate connected to the power electronic device, the cold plate comprising:
      a first outer surface;
      a first face wall formed on the first outer surface;
      an inner portion formed by the first outer surface; and
      a flow channel formed within the inner portion, the flow channel comprising:
         an inlet aperture; and
         an outlet aperture,
      wherein each of the inlet and the outlet apertures are formed in the first face wall, and
      wherein the flow channel extends between the inlet aperture and the outlet aperture, and is structured to circulate liquid coolant;
   an isolating manifold constructed of an insulating material, comprising:
      a second outer surface, comprising:
         a second face wall formed on the second outer surface; and
         a third face wall formed on the second outer surface opposite the second face wall,
      wherein the second face wall is aligned with and oriented toward the first face wall;
      a first aperture formed in the third face wall extending through the second face wall and aligned with the inlet aperture of the cold plate; and a second aperture formed in the third face wall extending through the second face wall and aligned with the outlet aperture of the cold plate; and a ceramic coating formed on one or both surfaces of the first face wall and the second face wall to join together the cold plate and the isolating manifold, and a surface of the flow channel.

2. The apparatus of claim 1, wherein the ceramic coating is deposited directly on the surface of the first face wall.

3. The apparatus of claim 1, further comprising a seal mechanism disposed at an interface of the cold plate and the isolating manifold.

4. The apparatus of claim 3, wherein the ceramic coating is deposited on the first face wall of the cold plate and the seal mechanism is in contact with the ceramic coating.

5. The apparatus of claim 3, wherein the seal mechanism is selected from a gasket and an O-ring.

6. The apparatus of claim 1, wherein the ceramic coating originates from a composition selected from pure ceramic, ceramic-based compositions and ceramic-containing compositions.

7. The apparatus of claim 6, wherein the ceramic coating comprises a material selected from the group consisting of boron nitride, alumina, aluminum nitride, silica and mixtures thereof.

8. The apparatus of claim 1, wherein the insulating material is selected from plastic, ceramic and mixtures thereof.

9. The apparatus of claim 1, wherein each of the first and second apertures formed in the side wall of the isolating manifold has inserted therein a connector for engaging a path to a supply of the liquid coolant.

10. The apparatus of claim 9, wherein the connector in the first aperture interfaces with the inlet aperture of the flow channel and the connector in the second aperture interfaces with the outlet aperture of the flow channel.

11. The apparatus of claim 10, wherein the connector has a threaded portion.

* * * * *